US007238989B2

(12) United States Patent
Yeo et al.

(10) Patent No.: US 7,238,989 B2
(45) Date of Patent: Jul. 3, 2007

(54) STRAIN BALANCED STRUCTURE WITH A TENSILE STRAINED SILICON CHANNEL AND A COMPRESSIVE STRAINED SILICON-GERMANIUM CHANNEL FOR CMOS PERFORMANCE ENHANCEMENT

(75) Inventors: Yee-Chia Yeo, Singapore (SG); Chun-Chieh Lin, Hsin-Chu (TW); Fu-Liang Yang, Hsin-Chu (TW); Mong-Song Liang, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 161 days.

(21) Appl. No.: 11/201,990

(22) Filed: Aug. 11, 2005

(65) Prior Publication Data
US 2005/0272188 A1 Dec. 8, 2005

Related U.S. Application Data

(63) Continuation of application No. 10/383,709, filed on Mar. 7, 2003, now Pat. No. 6,955,952.

(51) Int. Cl.
*H01L 27/01* (2006.01)
(52) U.S. Cl. ..................................... 257/350; 257/347

(58) Field of Classification Search .................. 257/67, 257/347, 348, 350, 351, 401, 616, 618, E27.112
See application file for complete search history.

(56) References Cited

U.S. PATENT DOCUMENTS 6,339,232 B1 * 1/2002 Takagi ......................... 257/192

* cited by examiner

*Primary Examiner*—David Vu
(74) *Attorney, Agent, or Firm*—Haynes and Boone, LLP

(57) ABSTRACT

A method of fabricating a CMOS device wherein mobility enhancement of both the NMOS and PMOS elements is realized via strain induced band structure modification, has been developed. The NMOS element is formed featuring a silicon channel region under biaxial strain while the PMOS element is simultaneously formed featuring a SiGe channel region under biaxial compressive strain. A novel process sequence allowing formation of a thicker silicon layer overlying a SiGe layer, allows the NMOS channel region to exist in the silicon layer overlying a SiGe layer, allows the NMOS channel region to exist in the silicon layer which is under biaxial tensile strain enhancing electron mobility. The same novel process sequence results in the presence of a thinner silicon layer, overlying the same SiGe layer in the PMOS region, allowing the PMOS channel region to exist in the biaxial compressively strained SiGe layer, resulting in hole mobility enhancement.

19 Claims, 5 Drawing Sheets

STRAIN BALANCED STRUCTURE WITH A TENSILE STRAINED SILICON CHANNEL AND A COMPRESSIVE STRAINED SILICON-GERMANIUM CHANNEL FOR CMOS PERFORMANCE ENHANCEMENT

RELATED APPLICATIONS

This application is a continuation of U.S. application Ser. No. 10/383,709 filed Mar. 7, 2003, now U.S. Pat. No. 6,955,952 entitled, "A Strain Balanced Structure With a Tensile-Strained Silicon Channel and a Compressive Strained Silicon-Germanium Channel for CMOS Performance Enhancement."

BACKGROUND OF THE INVENTION (1) Field of the Invention

The present invention relates to methods employed to fabricate semiconductor devices, and more specifically to a method used for fabrication of a complementary metal oxide semiconductor (CMOS) device, using strained layers for the channel regions of the N channel metal oxide semiconductor (NMOS) device, and for the P channel metal oxide semiconductor (PMOS)

(2) Description of Prior Art

Strain induced band structure modification and mobility enhancement, used to increase drive current, can be an attractive feature if implemented for CMOS devices. Enhanced electron mobility in silicon under biaxial tensile strain, and enhanced hole mobility in silicon-germanium (SiGe), under biaxial compressive strain, if properly integrated in CMOS fabrication sequence would enhance the performance for both the NMOS and PMOS devices. This invention will describe a novel process sequence in which stacked layer structures, one comprised of thin silicon on SiGe, and the other comprised of thicker silicon on SiGe, provide the channel region under biaxial tensile strain needed for NMOS performance enhancement, as well as the channel region under biaxial compressive strain needed for PMOS performance enhancement. Prior art, such as Chu et al, in U.S. Pat. No. 5,906,951, Leoues et al, in U.S. Pat. No. 5,659,187, Kawakubo et al, in U.S. Pat. No. 6,165,837, Fitzgerald et al, in U.S. Pat. No. 6,291,321, Solomon et al, in U.S. Pat. No. 5,019,882, and Murakami et al, in U.S. Pat. No. 5,241,197, offer procedures for forming strained layers on insulator. However these prior arts do not describe the novelty of this present invention in which a fabrication sequence for an NMOS channel region under biaxial tensile stress, and a PMOS channel region under biaxial compressive stress, allows formation of these desired channel regions on the same semiconductor substrate allowing CMOS performance enhancement to be realized.

SUMMARY OF THE INVENTION

It is an object of this invention to fabricate a CMOS device featuring enhanced carrier mobility to be accomplished via use of channel regions comprised of biaxial tensile strain, as well as via use of channel regions featuring biaxial compressive strain.

It is another object of this invention to use a stacked layer of thin silicon on SiGe to provide a SiGe channel region featuring the biaxial compressive strain needed for increased hole mobility for the PMOS device, and to use a stacked layer of thicker silicon on SiGe to provide a silicon channel region featuring the biaxial tensile strain needed for increased electron mobility for the NMOS device.

It is still another object of this invention to form a tensile strained Si channel region, as well as a compressive strain SiGe channel region, not dependent on the interface located between the semiconductor layer, silicon or SiGe, and the underlying silicon oxide surface, being either accommodating or non-accommodating.

In accordance with the present invention a method of fabricating a CMOS device featuring an NMOS device comprised with a biaxial tensile strain silicon channel region, and a PMOS device comprised with a biaxial compressive strain SiGe channel, is described. A first embodiment of this invention features formation of the CMOS device on a underlying semiconductor-silicon oxide substrate. Note that the interface between the bottom-most semiconductor layer and the silicon oxide layer has to be freely accommodating as possible so that is allows a desired change in the lattice constant of the bottom semiconductor layer to be realized. This can optimally be accomplished via breaking or relaxation of the bonds at the semiconductor-silicon oxide interface via ion implantation procedures. A layer of SiGe, under compressive strain, is grown on the semiconductor or silicon on oxide (SOI), with the thickness of the SiGe layer comparable to the thickness of the underlying silicon layer. This is followed by growth of an overlying silicon layer, at a thickness comparable to the thickness of the underlying SiGe layer, and comparable to the thickness of the underlying silicon layer. An insulator shape is next formed on the portion of overlying silicon layer located in a subsequent PMOS region, followed by selective growth of additional silicon on the portion of overlying silicon layer exposed in a region to be subsequently used as an NMOS region. This will allow electrons to be contained in the thicker, tensile strained silicon channel region for the NMOS device, while the thinner silicon layer will result in the PMOS carriers residing in the compressively strained underlying SiGe layer. After removal of the masking insulator shape a gate insulator layer is formed, followed by the definition of a N type gate structure in the NMOS region, and a P type gate structure in the PMOS regions. Raised source/drain regions for both type devices are achieved via deposition of undoped silicon regions, followed by ion implantation to form the heavily doped source and drain regions.

A second embodiment to this invention entails the formation of a CMOS device in a tensile strained silicon channel, and in a compressively strained SiGe channel, on a SiGe-silicon oxide substrate, with the interface between the SiGe layer and the silicon oxide layer not necessarily being freely accommodating. A second SiGe layer is grown on the surface of the SiGe-silicon oxide substrate, with the mole content of Ge in the second SiGe layer larger than the mole content of Ge in the underlying SiGe layer, allowing the overlying SiGe layer to be under biaxial compressive strain. A thin layer of silicon layer is next grown on the top surface of the second SiGe layer followed by additional silicon deposition only on the portion of the thin silicon layer located in a region to be used for the NMOS device. Formation of the gate insulator layer, gate structures, and raised source/drain regions are achieved using procedures identical to the procedures described for the first embodiment.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
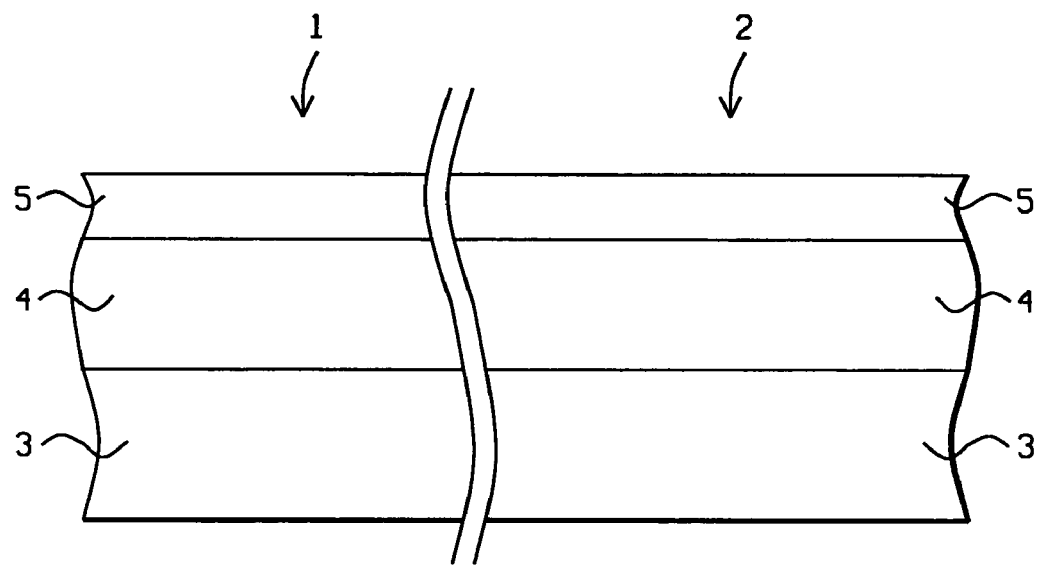
FIGS. 1-6, which schematically in cross-sectional style describe a first embodiment of this invention, in which an NMOS device is formed featuring a silicon channel region under biaxial tensile strain, and in which a PMOS device is formed featuring a SiGe channel region under biaxial compressive strain, with both type devices formed on a silicon on oxide substrate exhibiting an accommodating silicon-oxide interface.

The method of forming a CMOS device on a semiconductor on a oxide substrate, featuring a NMOS element formed in a silicon channel region under biaxial tensile strain, and featuring a PMOS element formed in a SiGe channel region under biaxial compressive strain, will now be described in detail. In the first embodiment of this invention, a silicon on insulator (SOI) substrate is used, with the interface between the silicon layer and the underlying insulator layer rendered freely accommodating to a change in the lattice constant of the silicon layer via implanted atoms used to break or relax the bonds at the silicon-insulator interface. Semiconductor substrate 3, comprised of P type, single crystalline silicon with a <100> crystallographic orientation is used and schematically shown in FIG. 1. Silicon oxide layer 4, at a thickness between about 250 to 5000 Angstroms, is formed on the top surface of semiconductor substrate 3, via thermal oxidation or chemical vapor deposition procedures. First silicon layer 5, is achieved from a donor silicon wafer bonded to the underlying top surface of silicon oxide layer 4, of the recipient substrate comprised silicon oxide layer 4, on semiconductor substrate 3. Removal of portions of, or thinning of the donor silicon wafer, via a chemical mechanical polishing procedure, results in first silicon layer 5, on silicon oxide layer 4. The interface of first silicon layer 5, and silicon oxide layer 4, is subjected to implantation of ions such as Si, Ge, Ar, Kr, Xe, and N, at an energy between about 0 to 100 KeV, and at a dose above 1E15 atoms/cm$^2$, rendering the interface freely accommodating to the change in lattice constant of first silicon layer 5. The thickness of first silicon layer 5, thinned from a donor wafer after bonding the recipient wafer comprised with a top component of silicon oxide layer 4, is between about 20 to 800 Angstroms. This is schematically shown in FIG. 1. Region 1, of the underlying SOI substrate will be used for accommodation of the PMOS element of the CMOS device, while region 2, will be used to accommodate the NMOS element.

Figure 2:
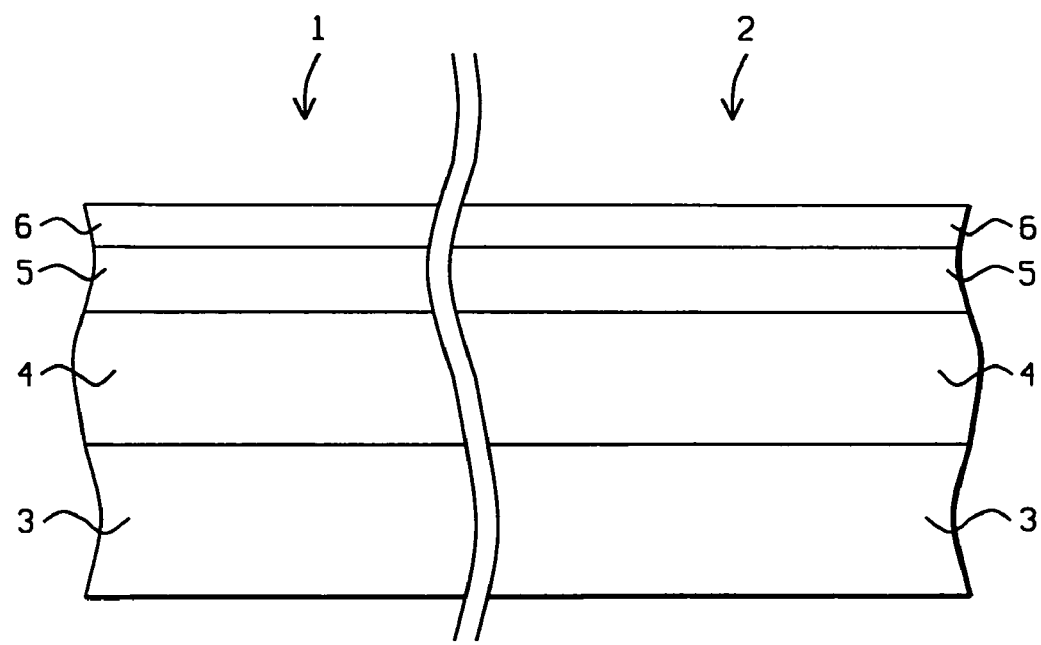

Silicon-germanium (SiGe) layer 6, is next epitaxially grown on first silicon layer 5, at a thickness between about 20 to 800 Angstroms. If the thickness of SiGe layer 6, is comparable to that of first silicon layer 5, a strain balanced structure, shown schematically in FIG. 2, is obtained, where first silicon layer 5, is under biaxial tensile strain while SiGe layer 6, is under biaxial compressive strain. SiGe layer 6, is grown at a temperature between about 500 to 800° C., using silane or disilane, and germane as reactants. The mole fraction of germanium in SiGe layer 6, is between about 0.05 to 0.8.

Figure 3:
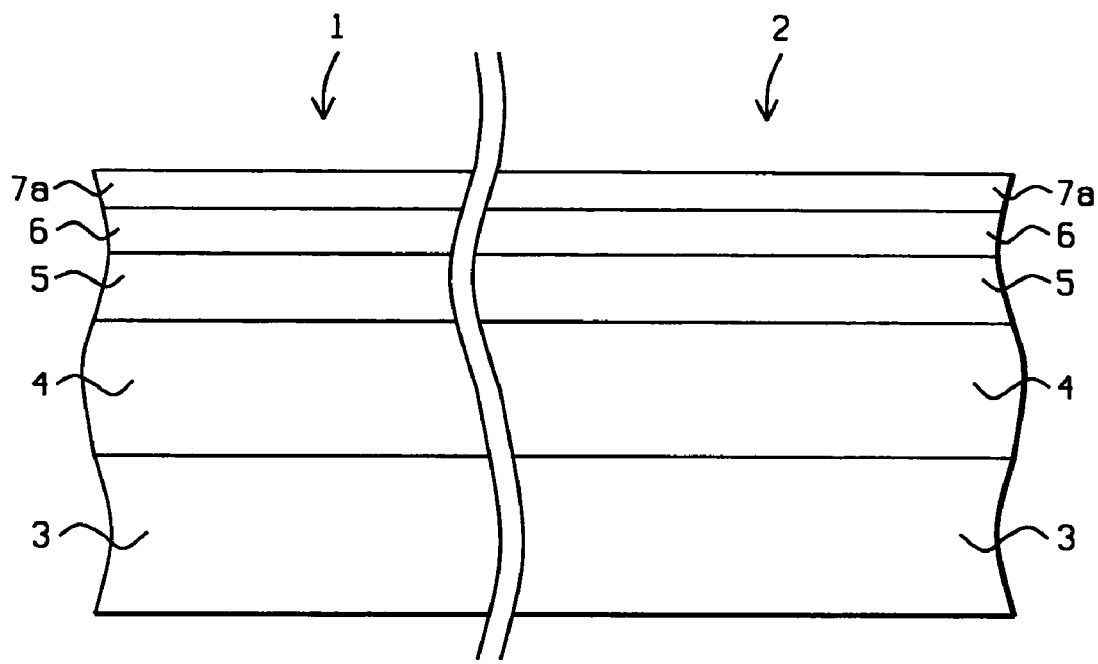

Second silicon layer 7a, is next epitaxially grown on SiGe layer 6, at a thickness between about 200 to 400 Angstroms. Second silicon layer 7a, under biaxial tensile strain, is epitaxially grown at a temperature between about 500 to 800° C., using silane or disilane as a source. This is schematically shown in FIG. 3.

For PMOS devices to be subsequently formed in region 1, second silicon layer 7a, is designed thin enough so that a parasitic channel does not form in it when the device is turned on, so that the thickness of SiGe layer 6, will contain most of the mobile carriers. The SiGe layer is under biaxial compressive strain and thus has significant hole transport properties. The germanium content, between about 0.05 to 0.8 mole fraction, has to be high enough so that significant performance enhancement for the PMOS device can be realized, but not so high that the junction leakage results. To effectively form the elements of the CMOS device a thin second silicon layer is needed for the PMOS device, to be formed in region 1, while a thicker silicon layer is needed for the biaxial strain in an N channel region of the NMOS device to be located in region 2.

Figure 4:
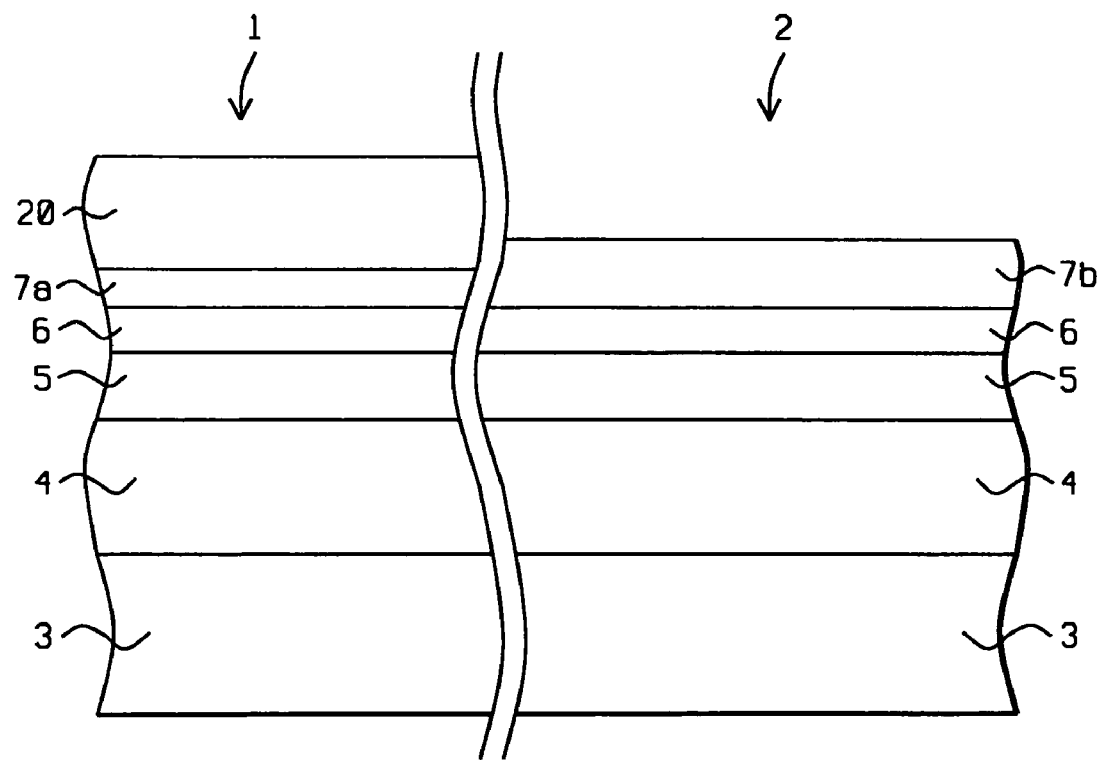

A method used to arrive at different silicon thicknesses for the topmost silicon layer, thin silicon for the PMOS device and a thicker silicon layer for the NMOS device, is now described and schematically shown in FIG. 4. Insulator layer 20, such as silicon oxide or silicon nitride, is first deposited via low pressure chemical vapor deposition (LPCVD), or via plasma enhanced chemical vapor deposition (PECVD), procedures, at a thickness between about 500 to 3000 Angstroms. A photoresist shape, not shown in the drawings, is used to protect the portion of insulator layer 20, located in PMOS region 1, from a dry etch procedure used to selectively remove a portion of insulator layer 20, exposing the top surface of second silicon layer 7a, in region 2. This is accomplished using $CHF_3$ as a selective etchant for insulator layer 20. After removal of the masking photoresist shape via plasma oxygen ashing procedures, an epitaxial deposition procedure is employed to grow additional silicon on the exposed top surface of second silicon layer 7a, in region 2, while no additional silicon growth is realized on insulator layer 20, located in region 1. The selective epitaxial growth is accomplished at a temperature between about 500 to 800° C., using silane or disilane and hydrogen chloride as a source, resulting in a third silicon layer, at a thickness between about 20 to 600 Angstroms, located overlying SiGe layer 6, in NMOS region 2. Third silicon layer 7b, is comprised with a sufficient thickness to contain the inversion electron charge in the N channel region, while the thinner, second silicon layer 7a, located in PMOS region 1, is thin enough to avoid a parasitic channel in the PMOS device, allowing the hole movement to occur in the underlying, biaxial compressively strained, SiGe layer 6.

Figure 5:
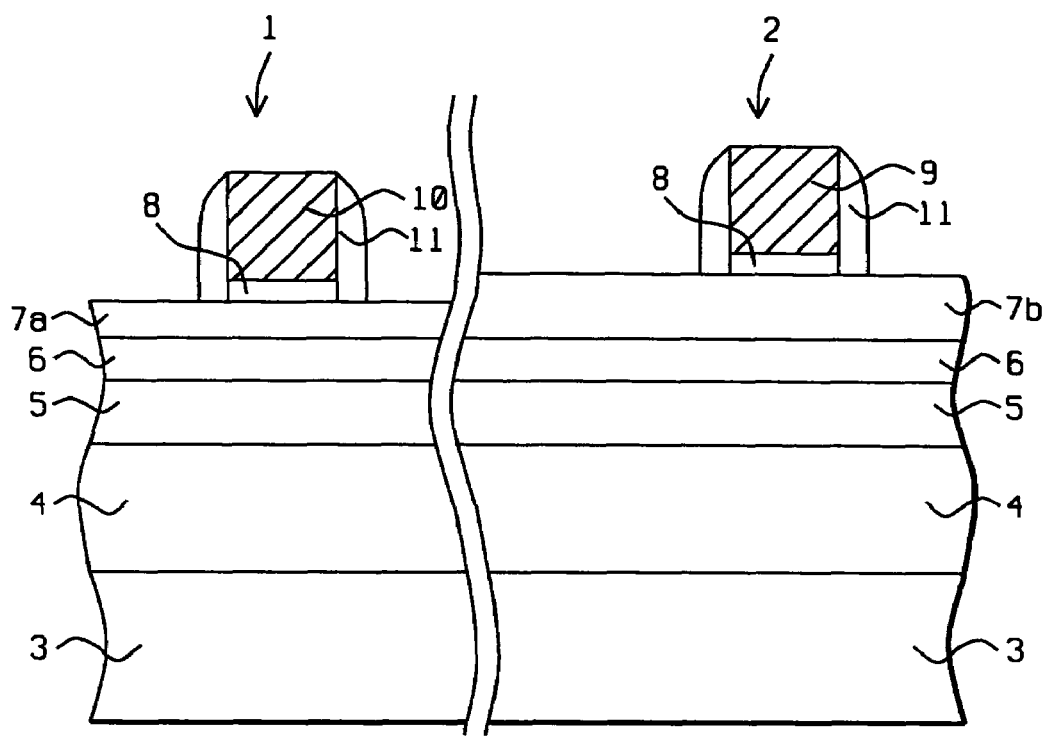
Figure 6:
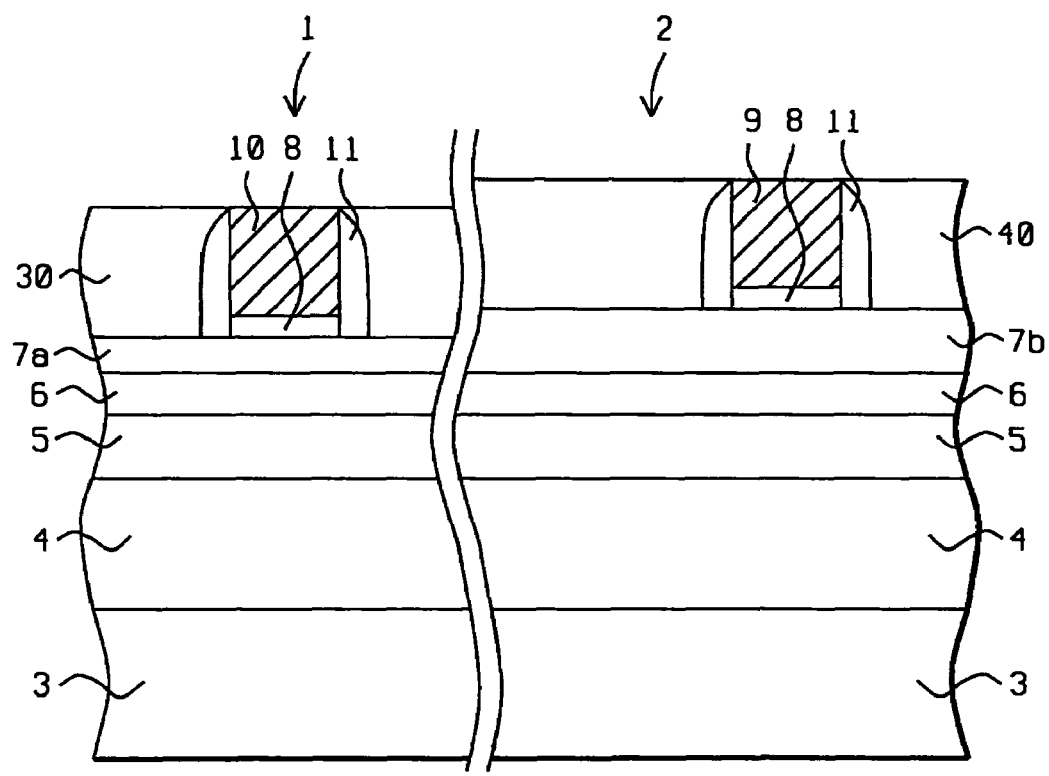

The completion of the CMOS device featuring an NMOS device in region 2, and a PMOS device in region 1, is next addressed and schematically described using FIGS. 5-6. Gate insulator 8, comprised of silicon dioxide at a thickness between about 5 to 100 Angstroms, is thermally grown at a temperature between about 600 to 1000° C., in an oxygen-steam ambient. The thermal oxidation procedure only consumes a top portion of second silicon layer 7a, in PMOS region 1, and a top portion of third silicon layer 7b, in NMOS region 2, avoiding consumption of underlying SiGe layer 6, in the oxidation procedure. Note that gate insulator layer 8, may also be silicon oxynitride, hafnium oxide, zirconium oxide, aluminum oxide, and lanthanum oxide, which can be formed by chemical vapor deposition methods or by sputtering procedures. A P type doped gate structure is next formed in PMOS region 1, while an N type doped gate structure formed in NMOS region 2. This is accomplished via deposition of an intrinsic polysilicon layer at a thickness between about 500 to 2000 Angstroms using LPCVD procedures. Photolithographic masking is then used to allow a P type ion implantation procedure to dope the portion of the polysilicon layer exposed in PMOS region 1, while similar photolithographic masking is used to block out the P type doped polysilicon layer during an N type ion implantation procedure, used to implant N type ions into an exposed portion of the polysilicon layer located in NMOS region 2. Another photoresist shape is then used as an etch mask allowing an anisotropic reactive ion etching procedure to selectively define P type polysilicon gate structure 10, in PMOS region 1, and to define N type polysilicon gate structure 9, in NMOS region 2. The reactive ion etching procedure is performed using $SF_6$ or $Cl_2$ as an etchant for polysilicon, with the selective etch procedure terminating at the appearance of gate insulator layer 8. Removal of the photoresist shape used for definition of the gate structures, via plasma oxygen ashing, concludes with a final buffered hydrofluoric acid clean which removes the exposed portions of gate insulator layer 8, not covered by the gate structures. Insulator spacers 11, are next formed on the sides of the gate structures via deposition of an insulator layer such as silicon oxide or silicon nitride, via LPCVD or PECVD procedures at a thickness between about 500 to 2000 Angstroms. An anisotropic reactive ion etching procedure, using $CHF_3$ or $CF_4$ as a selective etchant for the insulator layer, is then eraployed to define insulator spacers 11. The result of these procedures is schematically shown in FIG. 5.

Raised source/drain shapes are next formed via selective growth of intrinsic silicon, propagating from the top surface of second silicon layer 7a, in PMOS region 1, and propagating from the top surface of third silicon layer 7b, in NMOS region 2. The selective silicon growth is terminated when the heights of the raised source/drain shapes are between about 200 to 800 Angstroms. Photo masking shapes are again employed to allow a P type ion implantation procedure to dope the selective silicon shape in PMOS region, resulting in P type source/drain region 30, and to allow an N type ion implantation procedure to dope the selective silicon shape in NMOS region 2, resulting in N type source/drain region 40. An anneal procedure, performed at a temperature between about 850 to 1100° C., is used to activate the implanted ions in the source/drain regions. This is schematically shown in FIG. 6. If desired the raised source/drain shapes can be obtained in a polysilicon layer, deposited then etched back to a height again equal to the height of the gate structures, followed by the photo masking and ion implantation doping procedures described for the raised selective silicon source/drain shapes.

Performance enhancement is now realized for both type of CMOS devices. The biaxial compressive strain improves PMOS hole transport properties in SiGe, while the biaxial tensile strain in silicon leads to enhanced NMOS electron velocity. The spirit of this invention is the compromise of lattice constants of thin layers of semiconductor material with different lattice constants in the relaxed state, so that those materials with a smaller lattice constant would be under tensile strain while those materials with a larger lattice constant would be under compressive strain. It is obvious that such a strain balanced structure need not be implemented using only a three layer structure as described above. A multiple layer structure consisting of Si—SiGe—Si—SiGe, or Si—SiGe—Si—$SiO_2$ would achieve the same objective. However the three layer structure such as the one described above is one of the simplest and most straightforward.

Figure 7:
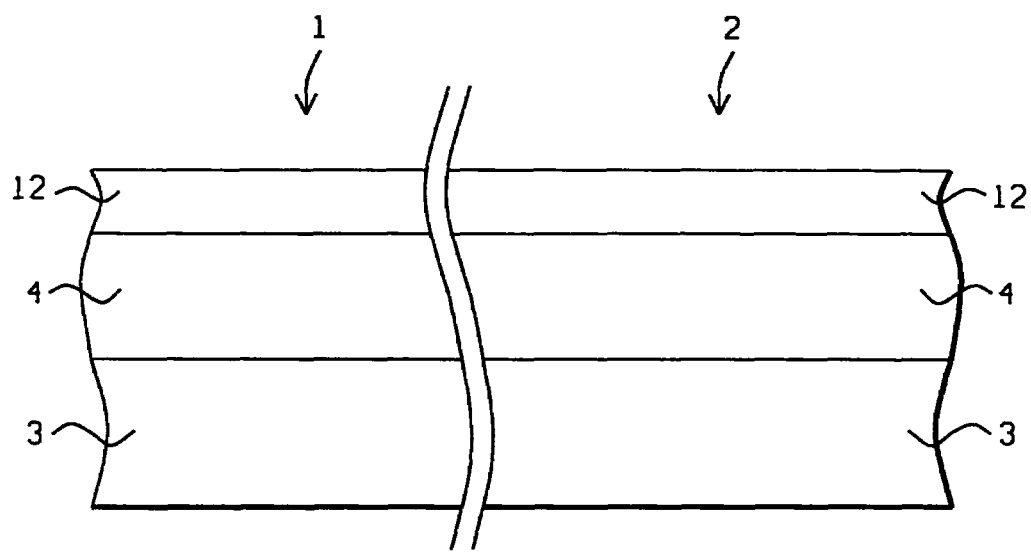
FIGS. 7-10, which schematically in cross-sectional style describe a second embodiment of this invention, in which an NMOS device is formed featuring a silicon channel region under biaxial tensile strain, and in which a PMOS device is formed featuring a SiGe channel region under biaxial compressive strain, with both type devices formed on a SiGe-oxide substrate, in which the SiGe-oxide interface does not necessarily have to be freely accommodating.

A second embodiment of this invention featuring a structure comprised with a tensile strain Si channel, and a compressive strain SiGe channel, formed regardless of whether the interface between the bottom-most semiconductor layer and an underlying silicon oxide layer is freely accommodating or not, will now be described. FIG. 7, describes an SOI wafer comprised of first SiGe layer 12, on silicon oxide layer 4, formed using a donor wafer comprised of the first SiGe layer, bonded to a recipient wafer featuring silicon oxide layer 4, using bonding and etch back procedures similar to the procedures used in the first embodiment wherein first silicon layer 5, of a donor wafer was bonded to silicon oxide layer 4, of a recipient wafer. The Ge content in first SiGe layer 12, denoted as x1, is between about 0.05 to 0.4 mole fraction, while the thickness of this layer denote as t1, is between about 20 to 800 Angstroms. Note that we may also begin with a silicon-on-insulator wafer with an ultrathin silicon layer, less than 100 Angstroms, grow a SiGe layer with a mole fraction of more than 0.2 and a thickness less than 800 Angstroms on it, and then diffuse the Ge to the interface with silicon dioxide to change the local band structure so that it behaves like a SiGe-on-insulator substrate as described above.

Figure 8:
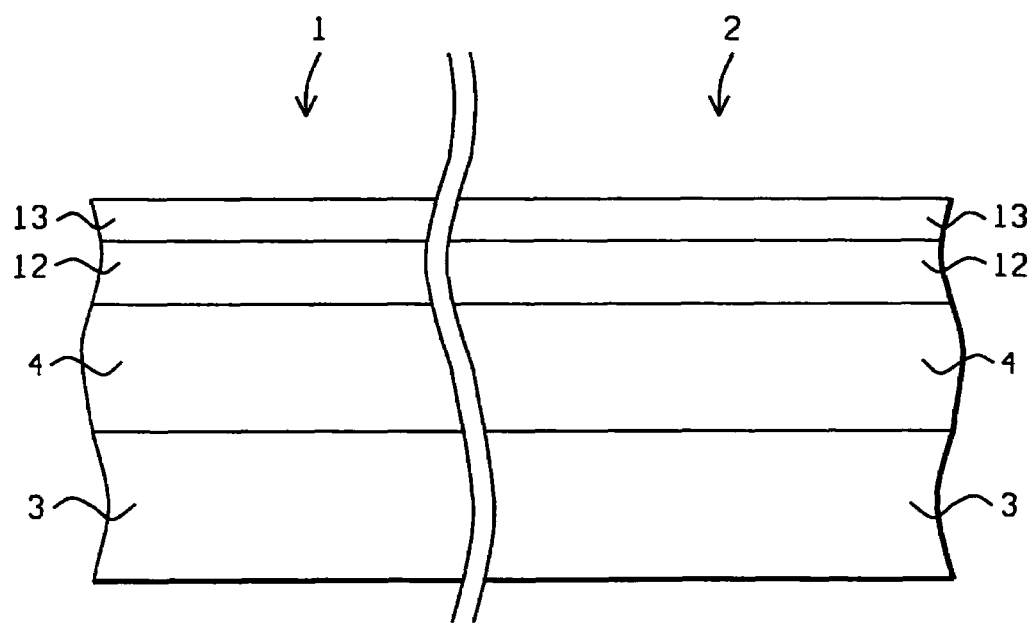

Second SiGe layer 13, schematically shown in FIG. 8, is next epitaxially grown on first SiGe layer 12, at a temperature between about 500 to 800° C., using silane or disilane, and germane as reactants. Second SiGe layer 13, is comprised with a Ge content of x2, between about 0.1 to 0.8 mole fraction, greater than Ge content x1 of first SiGe layer 12, and at a thickness denoted as t2, between about 20 to 800 Angstroms. This results in a biaxial compressive strain in second SiGe layer 13. The magnitude of the strain in SiGe layer 13, is a function of whether the bonds between SiGe layer 12, and silicon oxide layer 4, are freely accommodating or not. If the bonds are rigid, not freely accommodating, the magnitude of the strain in second SiGe layer 13, will be greater than if the bonds between those materials were freely accommodating.

Figure 9:
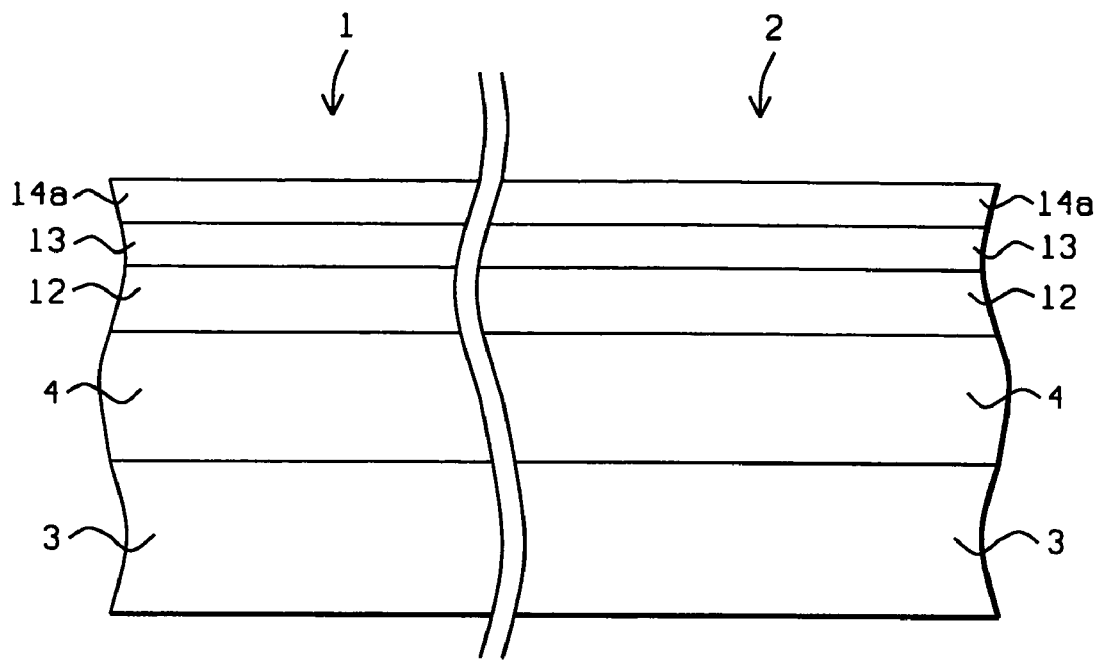
Figure 10:
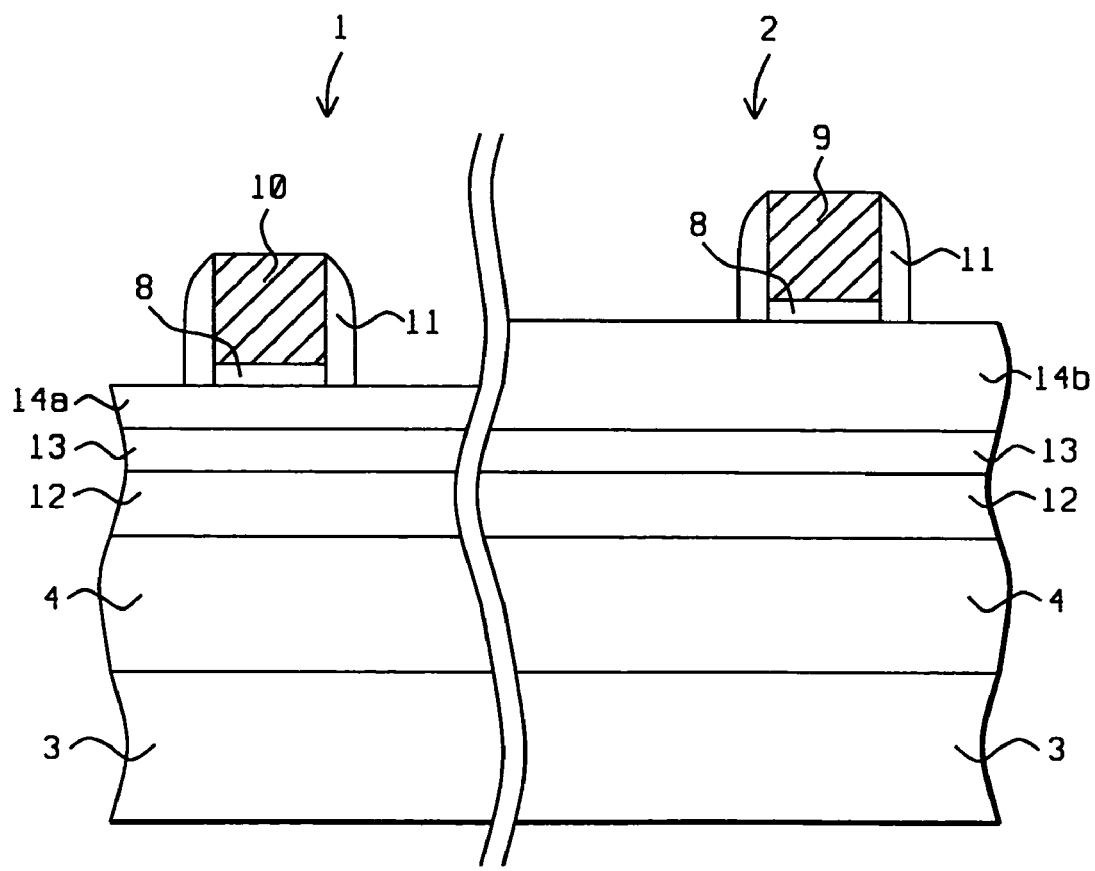

The remainder of the procedure featuring both tensile stained and compressive strained channels is identical to those procedures previously described in the first embodiment. A first silicon layer 14a, shown schematically is FIG. 9, is again epitaxially grown, followed by selective deposition of silicon deposition in NMOS region 2, on portions of first silicon layer 14a, not covered by an insulator shape, (not shown in the drawings), defined and used to prevent growth of silicon in PMOS region 1. The additional silicon growth in NMOS region 2, results in second silicon layer 14b, now under biaxial tensile strain. Processes identical to processes described in the first embodiment are used to complete the CMOS device. Gate insulator layer 8, and P type polysilicon gate structure, are formed in PMOS region 1, where a biaxial compressive strained channel region in SiGe results in enhanced hole mobility, while gate insulator layer 8, and N type polysilicon gate structure are formed in NMOS region 2, allowing enhanced electron mobility to be realized in the biaxial tensile strain charnel region in second silicon layer 14b.

While this invention has been particularly shown and described with reference to the preferred embodiments thereof, it will be understood by those skilled in the art that various changes in form and details may be made without departing from the spirit or scope of the invention.

What is claimed is:

1. A complementary metal oxide semiconductor (CMOS) circuit comprising:
of fabricating an N channel metal oxide semiconductor (NMOS) device and a P channel metal oxide semiconductor (PMOS) device, on the same semiconductor substrate, featuring channel regions comprised with biaxial strained layers, comprising the steps of:
   a silicon on insulator (SOI) substrate wherein a first silicon layer resides on a silicon oxide layer with a freely accommodating interface;
   a silicon-germanium (SiGe) layer on said first silicon layer;
   a second silicon layer on said SiGe layer, the second silicon layer having a first relatively thin portion in a first region and a second relatively thick portion in a second region;
   a P channel metal oxide semiconductor (PMOS) device formed in the first region; and
   an N channel metal oxide semiconductor (NMOS) device formed in the second region.

2. The circuit of claim 1, wherein said first silicon layer is between about 20 to 800 Angstroms in thickness.

3. The circuit of claim 1, wherein said freely accommodating interface between said first silicon layer and said silicon oxide layer is formed via an implantation procedure.

4. The circuit of claim 3, wherein said ion implantation procedure is performed using ions selected from a group containing Si, Ge, Ar, Kr, Xe, and N ions, at an energy between about 0 to 200 KeV, at a dose above 1E5 atoms/cm$^2$.

5. The circuit of claim 1, wherein said SiGe layer is obtained via epitaxial grown at a temperature between about 500 to 800° C., using silane or disilane, and germane as reactants.

6. The circuit of claim 1, wherein the thickness of said SiGe layer is between about 20 to 800 Angstroms.

7. The circuit of claim 1, wherein a mole fraction of germanium in said SiGe layer is between about 0.05 to 0.8.

8. The circuit of claim 1, wherein the first portion of the second silicon layer is obtained, at least in part, via epitaxial growth at a temperature between about 500 to 800° C., using silane or disilane as a source.

9. The circuit of claim 1, wherein the first portion of the second silicon layer has a thickness between about 20 to 400 Angstroms.

10. The circuit of claim 1, wherein the first portion of the second silicon layer covers both regions and the second portion is selectively formed on said first portion in the second region via an epitaxially growth procedure performed at a temperature between about 500 to 800° C., using silane or disilane as a source.

11. The circuit of claim 1, wherein the SiGe layer and the second silicon layer in the first region is under biaxial tensile stress, and the SiGe layer and second silicon layer in the second region is under biaxial compressive stress.

12. The circuit of claim 1, wherein said gate insulator layer is a silicon dioxide layer, obtained at a thickness between about 5 to 100 Angstroms.

13. The circuit of claim 12, wherein said silicon dioxide layer is obtained via a thermal oxidation procedure performed at a temperature between about 600 to 1000° C., in an oxygen-stream ambient.

14. A complimentary metal oxide semiconductor device comprising:
   a semiconductor on insulator (SOI) substrate comprised of a first SiGe layer overlying a silicon oxide layer;
   an N channel metal oxide semiconductor (NMOS) device featuring a silicon channel region under biaxial tensile strain, the NMOS device formed by selectively growing an optional second silicon layer on a second portion of said first silicon layer, in a region of said semiconductor substrate to be used for said NMOS device, resulting in a third silicon layer comprised of said second silicon layer on said first silicon layer; and
   a P channel metal oxide semiconductor (PMOS) device featuring a silicon-germanium (SiGe) channel region under biaxial compressive strain.

15. The device of claim 14, wherein said first SiGe layer, of said SOI substrate, is comprised with a thickness (t1), between about 20 to 800 Angstroms.

16. The device of claim 14, wherein the germanium content (x1), in said first SiGe layer is between about 0.05 to 0.2 mole fraction.

17. The device of claim 14, wherein said second SiGe layer is obtained via epitaxial growth at a temperature between about 500 to 800° C., using silane or disilane, and germane as reactants.

18. The device of claim 14, wherein said second SiGe layer is grown to a thickness (t2), between about 20 to 800 Angstroms.

19. The device of claim 14, wherein the germanium content (x2), in said second SiGe layer is between about 0.1 to 0.8 mole fraction, wherein x2 is greater than x1, the Ge content in said first SiGe layer.

* * * * *